(12) United States Patent
Fontius et al.

(10) Patent No.: US 7,439,742 B2
(45) Date of Patent: Oct. 21, 2008

(54) MAGNETIC RESONANCE RF TRANSMISSION ARRAY

(75) Inventors: Ulrich Fontius, Neunkirchen (DE); Rudi Baumgartl, Erlangen (DE); Franz Schmitt, Erlangen (DE); Georg Pirkl, Dormitz (DE); Bernd Stoeckel, Brooklyn, NY (US)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/605,780

(22) Filed: Nov. 28, 2006

(65) Prior Publication Data

US 2008/0122443 A1   May 29, 2008

(51) Int. Cl.
   *G01V 3/00*   (2006.01)
(52) U.S. Cl. .................. 324/318; 324/322; 600/422
(58) Field of Classification Search ............. 324/318, 324/322; 600/422
   See application file for complete search history.

(56) References Cited

U.S. PATENT DOCUMENTS

| | | | | |
|---|---|---|---|---|
| 4,668,915 A * | 5/1987 | Daubin et al. | ............... | 324/309 |
| 5,374,890 A * | 12/1994 | Zou et al. | ................... | 324/318 |
| 6,242,919 B1 * | 6/2001 | Zuk et al. | ................... | 324/322 |
| 6,456,072 B1 * | 9/2002 | Webb et al. | ................. | 324/308 |
| 6,940,282 B2 * | 9/2005 | Dumoulin et al. | ........... | 324/318 |

\* cited by examiner

*Primary Examiner*—Louis M Arana
(74) *Attorney, Agent, or Firm*—Schiff Hardin LLP

(57) ABSTRACT

In a magnetic resonance system and an operating method therefor, a number of independently operable radio frequency signal generator modules are provided or respectively connected to radio frequency coils. A control unit provides a synchronization signal to each of the radio frequency signal generator modules to selectively operate the modules to achieve different types of signal transmission. One of the radio frequency signal generator modules can serve as a master module, that receives the synchronization signal directly from the control unit, and supplies the synchronization signal to the other modules, functioning as slave modules.

17 Claims, 8 Drawing Sheets

MAGNETIC RESONANCE RF TRANSMISSION ARRAY

BACKGROUND OF THE INVENTION

1. Field of the Invention

The invention disclosure concerns a modularly magnetic resonance (MR) transmission system with a number of essentially similar PCI-TX modules, of which one is a "master module" and the others are "slave modules".

2. Description of the Prior Art

The following abbreviations and terms are used in the subsequent explanations:
Mod: modulator
RX: receiver
TX: transmit or transmit path
GPA: gradient power amplifier
SPA: shim power amplifier
RFPA: RF power amplifier
MRIR: MR image reconstruction=image computer
AMC: advanced measurement control=control computer with PCI-TX card
TALES: transmit antenna level sensor=RF volt meter for measurement of the transmission power
PCI: peripheral component interconnect=a bus standard that is used for, among other things, such TX modules
Synth: synthesizer
RFSWD: RF safety watch dog
SAR: specific absorption rate
NCO: numerical controlled oscillator
RX1 to RX4: receiver cassettes 1 through 4

An MR system conventionally has the following TX (transmit) channels:

One RF transmission channel that is very fast and can be controlled/modified in a µsec clock pulse in terms of amplitude and phase and, to a limited degree, also in terms of the frequency. The RF values are varied during the measurement.

Three gradient channels (Gx, Gy, Gz) that are very fast and can be controlled/modified in a µsec clock pulse in terms of amplitude and phase as well as in terms of the frequency. The gradient values are varied during the measurement.

Five shim channels (typically of the 2nd order) that are very slow and are typically altered only before and after an MR measurement.

SUMMARY OF THE INVENTION

An object of the present invention is to provide an MR system that is usable for multiple, varied applications by replication and (slight) modification of the TX channels.

This object is achieved in accordance with the invention by an MR system using a "clone concept" wherein a transmission channel can simply be "cloned" corresponding to the desired number of channels.

More specifically, the above object is achieved in accordance with the invention by an MR system with the invention by an MR having a number of radio-frequency signal shape generator modules (such as the AMCs) that are independent from one another but are connected, these radio-frequency signal shape generator modules being fashioned and arranged in order to respectively emit radio-frequency pulses via at least one of a number of radio-frequency coils, that can be activated independently. A central control arrangement which operates these radio-frequency signal shape generator modules by supplying respective synchronization signals to the individual units.

The use of a separate RF control unit is proposed in DE 101 24 465 A1. This document, however, does not describe how a synchronization of the RF control units actually ensues. Instead, a less-elaborate alternative with a distribution network is described in detail, via which alternative an output signal of a radio-frequency transmission amplifier is distributed to various transmission coils.

DESCRIPTION OF THE PREFERRED EMBODIMENTS

Figure 1:
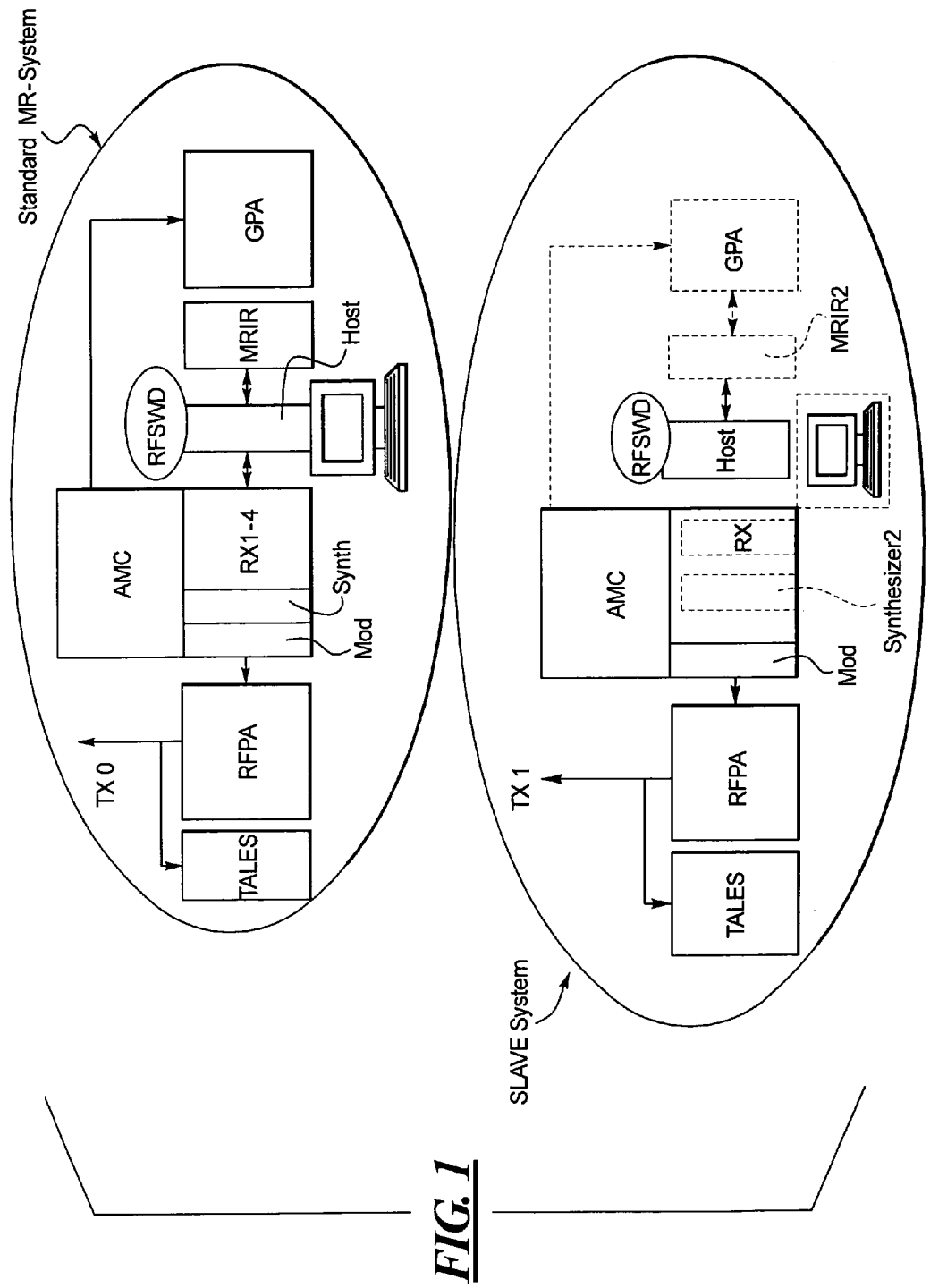
FIG. 1 schematically illustrates a conventional magnetic resonance system (top) and a slave system in accordance with the invention (bottom).

FIG. 1 shows the schematic design of a standard magnetic resonance system (top) and a modified slave system provided for usage in the inventive system (bottom).

In the standard system a measurement sequence is provided in a typical manner via a host computer with an associated terminal. This host computer is connected with a structural unit which, among other things, comprises a control computer (AMC), an analog modulator, a synthesizer and a plurality of receiver cassettes RX1 through RX4. The synthesizer serves to output the base frequency, for example of 125 MHz given a 1 H excitation. The modulator converts the digital signal generated by the AMC for the radio-frequency pulses into the analog RF signal and upmixes it for this corresponding with the desired base frequency. This radio-frequency signal arriving from the modulator is sent to the RFPA and made available there as a transmission signal. The TALES thereby monitors the emitted transmission power. This TALES is, moreover, in contact with the RFSWD (which is implemented as software on the host) in order to additionally monitor the radiated transmission power. The system moreover has in a typical manner a GPA which is likewise connected with the AMC and from there receives the specifications of which gradient pulses are to be emitted. Moreover, an MRIR is connected to the host in order to evaluate the signals received with the receiver cassettes RX1-RX4 and to reconstruct the images.

The AMC is the actual control computer with what is known as the PCI-TX card that generates the measurement sequences provided by the host on the digital plane and forwards said measurement sequences to the further components (for example the radio-frequency signal to the modulator and then further to the RFPA and the gradient pulses to the GPA).

As can be seen in FIG. 1, a system can be used as a slave module that looks essentially just like the standard MR system. This system here also possesses a host, an AMC with a modulator, an RFPA and a TALES. Each transmission channel thus has its own SAR monitoring. The further components, such as a separate synthesizer, an RX module, an additional GPA and an MRIR are (just like the further terminal) purely optional. This means that these components can additionally be present at the individual slave modules and be used for specific applications. However, for many applications a simple slave system which does not comprise all of the optional components or comprises none of the optional components is sufficient.

As FIG. 1 shows, only the master module has an activation (control) for a GPA in order to activate the gradient coils Gx, Gy, Gz. Instead of a GPA, an SPA is activated by the slaves in order to implement a $B_0$ field shim via corresponding shim coils $S^1{}_1, S^1{}_2, S^1{}_3, \ldots, S^{N-1}{}_1, S^{N-1}{}_2, S^{N-1}{}_3$. However, this is merely an exemplary embodiment. These control channels can also be used for other purposes or, if applicable, not be used at all depending on the usage purpose of the system, as is subsequently explained. The system is moreover not limited to 8 channels; rather, arbitrarily many transmission channels can be realized.

Figure 2:
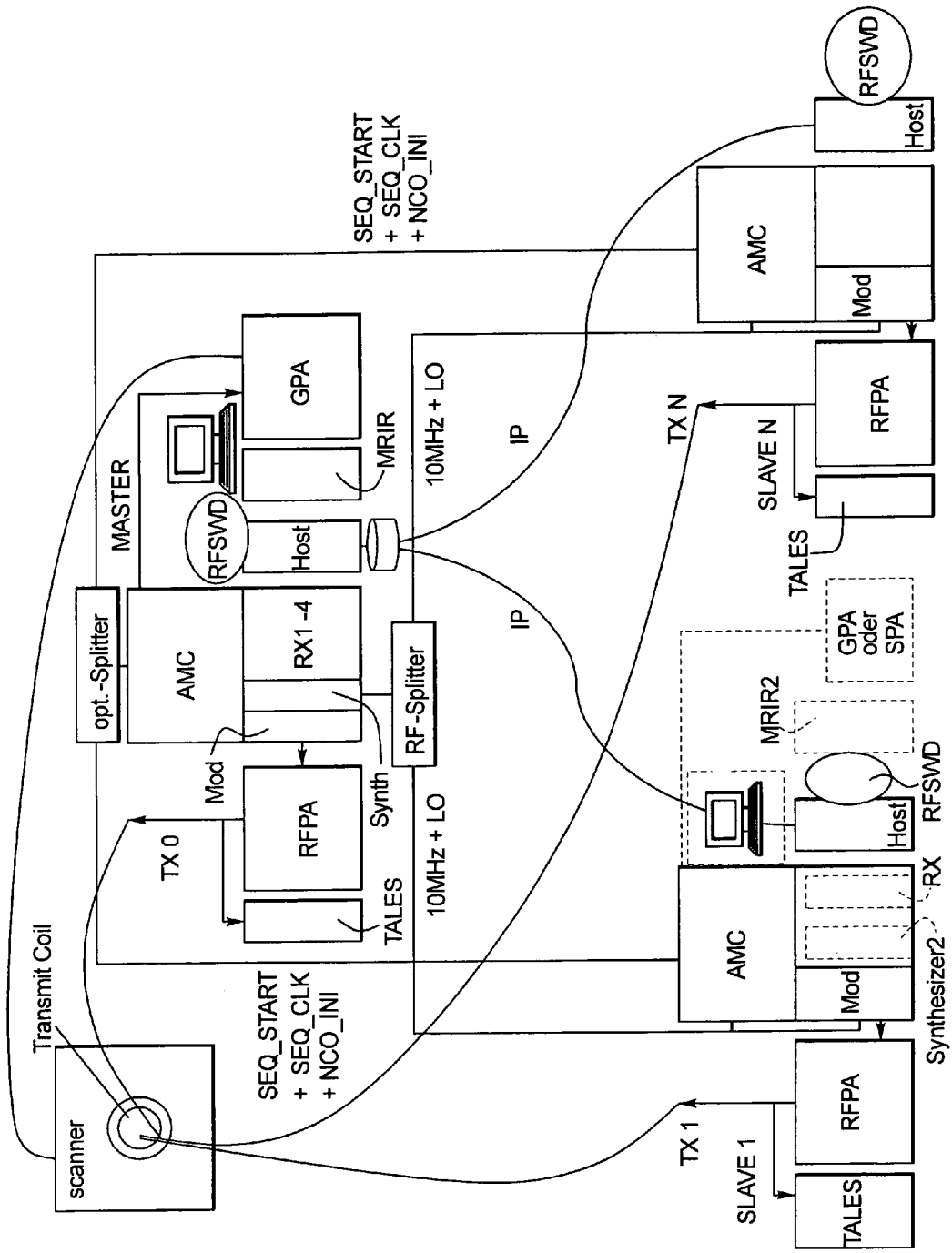
FIG. 2 shows how a master system and a number of slave modules are coupled among one another in accordance with the present invention.

FIG. 2 shows how these modules (meaning a master system and a number of slave modules) are coupled among one another and with the transmission coils ("transmit coil") in the scanner in order to operate as an inventive system. The master is thereby a complete, somewhat modified Siemens MR system which can also be operated independent of the slaves. For space reasons only the first slave module (slave 1) and the last slave module (slave N) are shown in FIG. 2. The system can have arbitrarily many slave modules. The N-th slave module is thereby shown in the minimal configuration and the first slave module (slave 1) is shown with the optional components.

The slave modules are thereby activated by the master module at various channels.

A handoff (transfer) of measurement jobs (which, for example, have been generated or selected and/or modified) in the form of measurement protocols via the console at the host of the master) to the hosts of the slaves ensues via the IP (or TCP/IP) connection shown in turquoise. Each slave thus receives its special measurement (sub-)job which precisely provides which measurement sequence is to be emitted by this appertaining slave for a subsequent measurement. Alternatively, a measurement job could also be directly sent from the master host to the AMCs of the slaves via a different connection. In this case a separate host at the slave is not absolutely necessary.

A system clock of 10 MHz is transferred out from the synthesizer of the master via the RF splitter drawn in red. On the other hand, the modulation frequency (mixing frequency) LO is also distributed from the master to the slaves via this RF splitter. This means that all slaves transmit with the same radio-frequency. However, if the individual transmission channels are operated with different frequencies, they optional synthesizers in the slaves could be used for this. The transfer of the modulation frequency (mixing frequency) LO from the synthesizer of the master to the slaves is then not necessary.

Moreover, in order to synchronize the NCOs of the individual AMCs of the slaves a fast external trigger signal as an actual start signal for a measurement (called SEQ_START in the following), a system clock of, for example, 100 KHz (called SEQ_CLK in the following) and a very short initialization pulse (called NCO_INI in the following) are distributed to the slaves via an optical splitter (green) connected to the AMC of the master. The master and the individual slaves thus generate correspondingly synchronized radio-frequency pulses that are respectively transmitted via the various RFPAs of the master and of the slaves as transmission signals TX 0, TX 1, . . . TX N to the transmit coil of the scanner.

All measurements of the master and of the slaves thus run independent of one another but nevertheless synchronously in the inventive design since all synchronization signals (such as the SEQ_CLK signal and the SEQ_START signal are transferred from the master).

Figure 3:
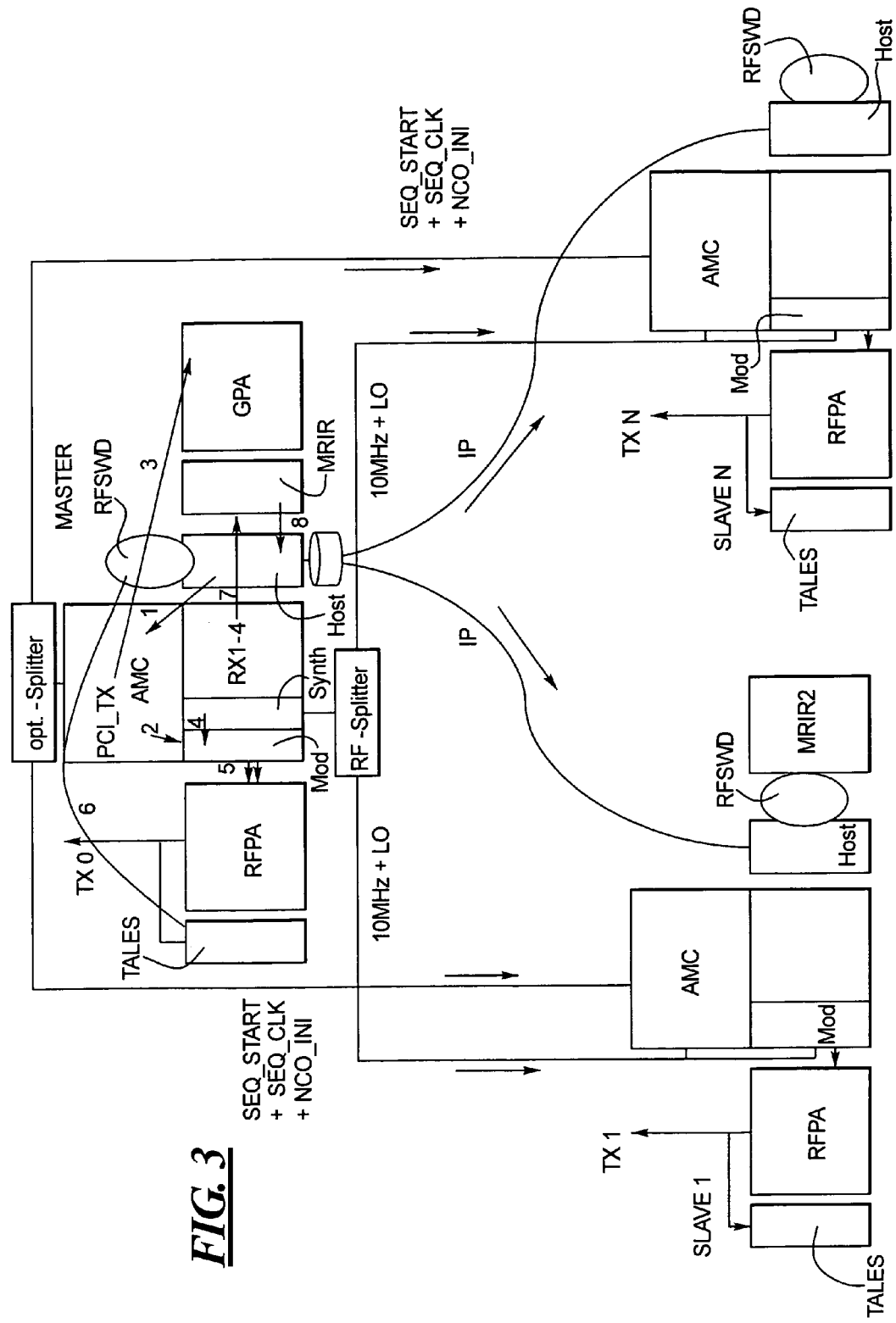
FIG. 3 illustrates a typical measurement workflow in the inventive system shown in FIG. 2.

FIG. 3 shows a typical measurement workflow in such a system as it is shown in FIG. 2 (in FIG. 3, however, the slave 1, like the slave N, has only the necessary components). The measurement workflow is represented using the arrow lines (only) within the master, whereby this process also occurs in parallel in the respective slaves that receive the corresponding measurement jobs in advance via the IP protocol and are then (as described in the preceding) synchronized by means of the signals distributed via the optical splitter and the RF splitter.

The shown workflow is as follows:

1) The measurement job (specification of the RF pulse envelopes) is provided by the host to the control computer.
2) The digital RF signals (with an intermediate frequency ZF of approximately 1.5 MHz) are respectively sent from the PCI-TX card to the modulator (Mod)
3) The PCI-TX card moreover delivers the digital data (gradient pulses) for the gradient amplifier.
4) The modulators respectively receive from the synthesizer the mixing frequency 125 MHz (for 1H; or other frequencies for other nuclei, for example 31P, . . . ).
5) The RF signal is passed to the respective RFPA,
6) TALES respectively measures the forward power and the reflected power. These power measurement values are evaluated by the respective control computer and host (RFSWD).
7) The acquisition signals are transferred from the receiver cassettes to the image computer.
8) The image computer reconstructs the images and sends these into the databank of the host.

Figure 4:
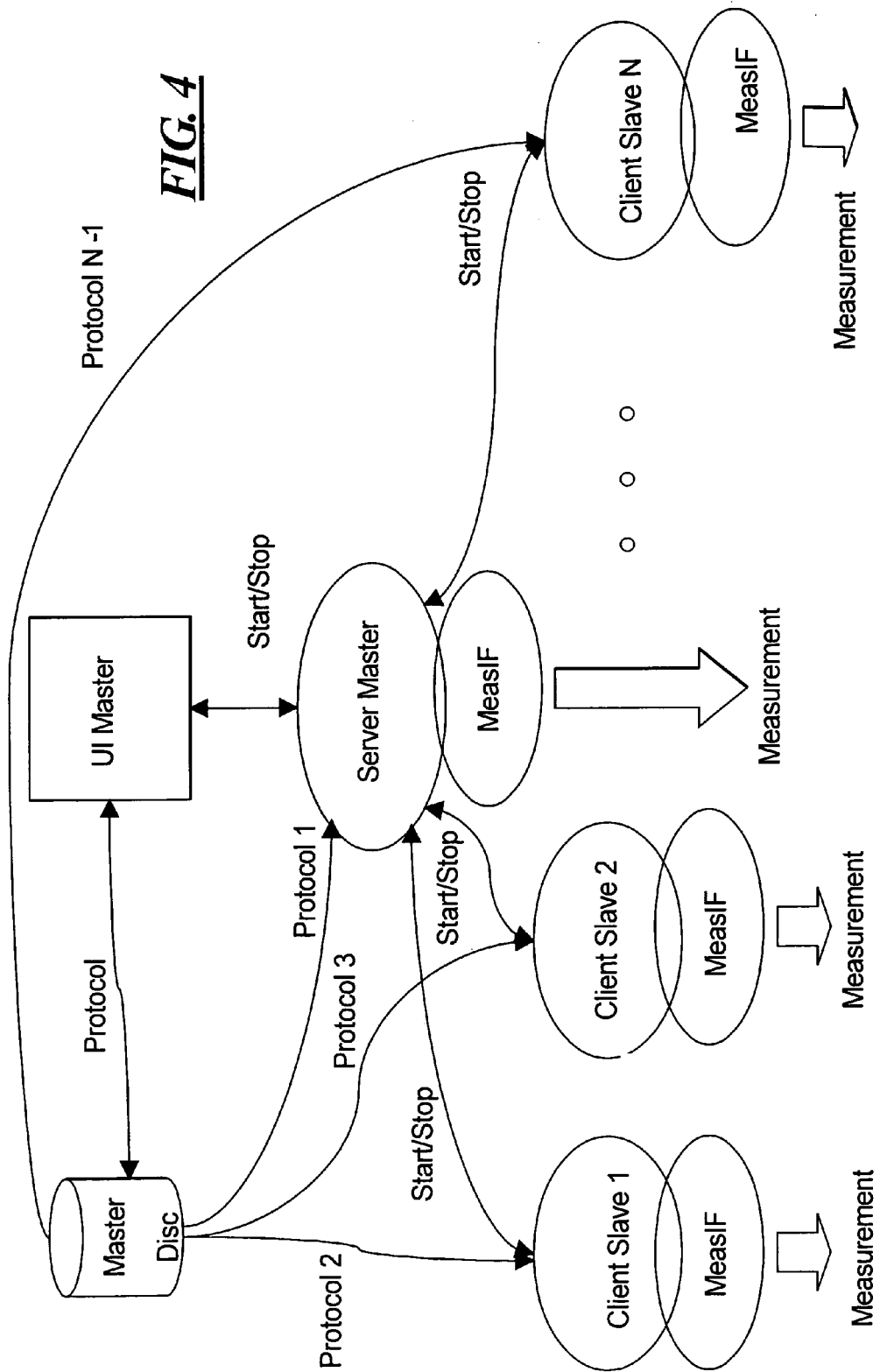
FIG. 4 illustrates how the measurement protocols are passed from the master module to the slave modules in accordance with the present invention, in the form of software architecture.

For clarification FIG. 4 shows how the measurement protocols are passed from the master module to the slave modules, but illustrating the software architecture of such a system. A user interface (UI master) is located at the master host which serves here as a server (server master). Moreover, this server master possesses a master disc on which the most varied protocols are stored or, respectively, on which protocols generated with the aid of the UI master can be stored and/or can be modified and/or can be selected. For example, with the aid of the UI master a protocol can then be selected from the master disc for a specific measurement and be modified if applicable. The various protocols are then transferred from the master disc to both the server master (i.e. the host of the master module) and to the various clients (client slave 1, client slave 2 . . . client slave N), i.e. the various hosts of the individual slave modules. These can hereby respectively be individually-generated protocols for the individual transmission channels, i.e. the master and the slaves. However, an overall protocol (comprising N sub-protocols) can also be created and selected for the entire TX array and the sub-protocols can be correspondingly transferred to the AMCs of the individual modules.

The user interface for the apparatus will allow the operator to browse and to edit a separate protocol for each individual TX channel. Alternatively an overall protocol with corresponding sub-protocols can also be selected for the complete measurement by displaying a further input field "TX array protocol". More possibilities arise for the user via the input of arbitrary protocols for each individual transmission channel. In most cases, however, a selection of a protocol with N pre-produced sub-protocols is reasonable in order to implement specific measurements since, in this case, the individual sub-protocols have already been tuned to one another and optimized for the corresponding measurement. In FIG. 4 it is shown that this protocol comes from a disc of the master module or is established and selected with the aid of the UI master. In principle such a protocol, or the sub-protocols, can also come from any arbitrary further computer, i.e. they can be created on an external computer and, for example, distributed both to the master and the associated clients (slaves) via IP.

A "Start Measurement" button will be located in the lower left corner on the user interface used to operate the system. When the operator clicks on this button, the measurement is finally started. For this (as shown in FIG. 4) a start/stop signal (also designated with SEQ_START" in FIGS. 2 and 3) is passed from the UI master to the server master, which correspondingly passes start/stop signals to the client slaves so that the measurements are started there with the aid of the respective measurement interfaces (measurement interfaces=MeasIF).

In this workflow it is important that the measurements are started at the slaves first. However, this do not yet run freely; rather, they are prepared at the individual slaves and wait for the trigger (i.e. the SEQ_START signal) from the master so that they can then run freely. This order must be retained, otherwise only the measurement on the master is executed. This triggering is explained more precisely later.

A somewhat more detailed design of the individual AMCs (control computers of the master and of the slaves) as well as their coupling among one another and the various synchronization levels are described below.

Figure 5:
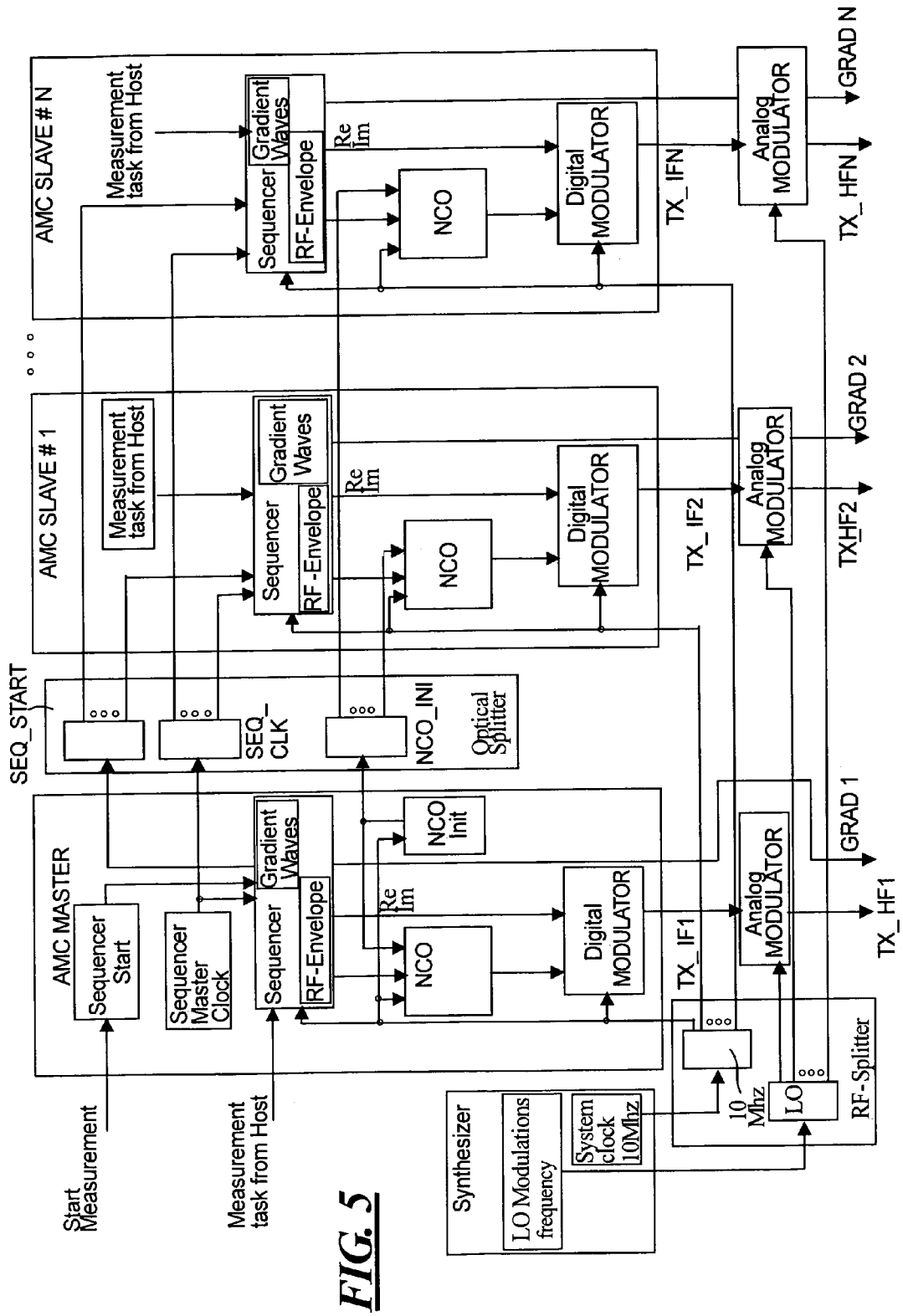
FIG. 5 illustrates the advanced measurement control (AMC) of the master module at the left, with the AMCs of two slave modules at the right.

FIG. 5 shows the AMC of the master module to the far right, next to this are the AMCs of two slave modules (slave #1; slave #N).

Figure 6:
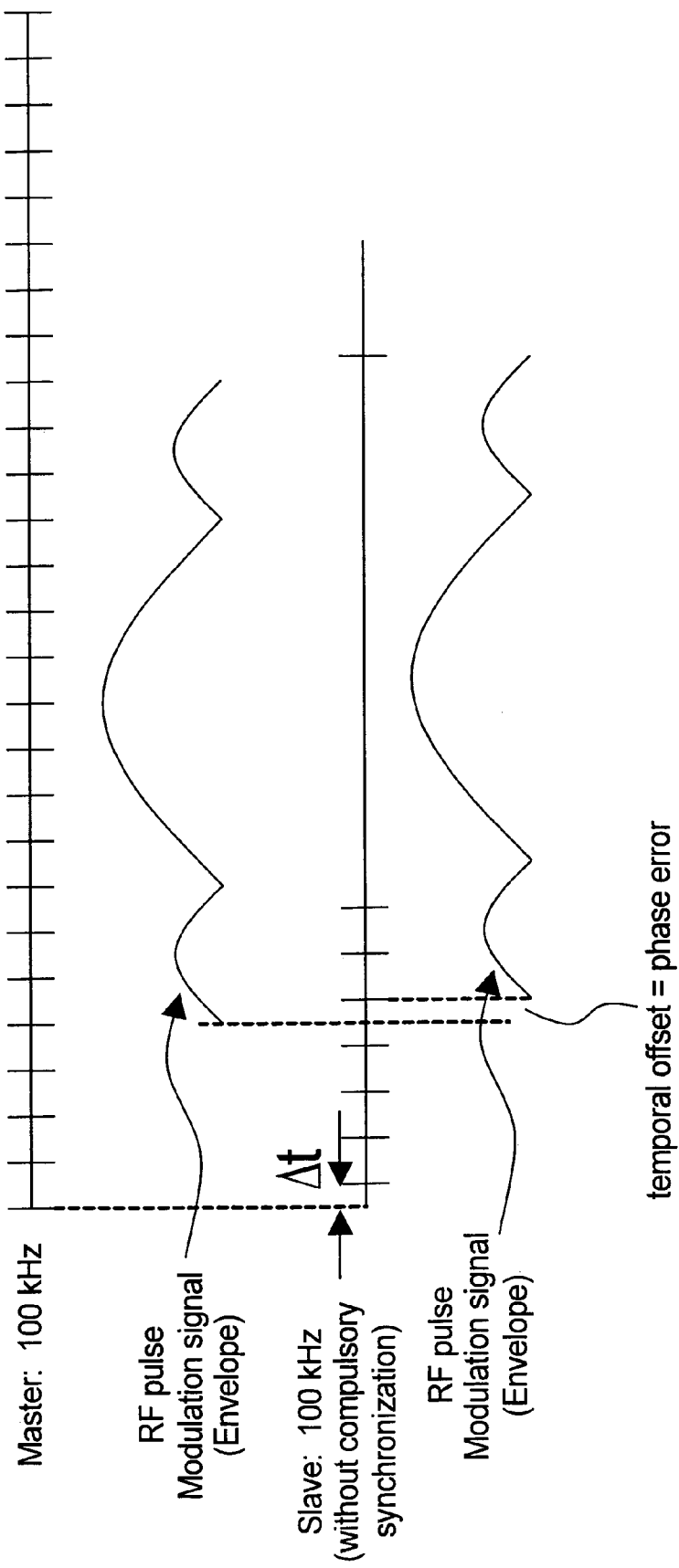
FIG. 6 illustrates the master/slave synchronization in accordance with the present invention.

The core of such an AMC is a computation unit which here is represented as a box "Sequencer" that contains further elements such as "RF Envelope" and "Gradient Waves". All of these components are realized in the form of software on the AMC. This sequencer essentially takes the data that arrive from the respective as a measurement job, classifies the sampling points (nodes) in the correct temporal pattern and scales the amplitudes. This means that the sequence here develops the pulse sequence to be sent to fulfill the measurement job, whereby the "RF Envelope" unit generates the envelope of the RF signal (i.e. the actual modulation of the RF signal (without the RF itself)) on the digital plane and the "Gradient Waves" unit correspondingly provides the digital modulation for the gradient pulses. This occurs separately in each of the AMCs, regardless of whether the AMC is of the master or of the slaves. Each of these AMCs receives corresponding measurement jobs from the respective host as this was previously described using FIGS. 4 through 6.

Each of the AMCs has its own NCO.

The parameters which describe the envelope of the RF signal, namely the frequency $\omega$ and the phase $\phi$, can respectively be passed in the appertaining AMC to the associated NCO. The NCO then generates a corresponding signal at the set intermediate frequency (for example of 1.5 MHz). This signal is then passed to a digital modulator of the respective AMCs. The real part (Re) and the imaginary part (Im) of the function describing the envelope can likewise be directly transferred to the Digital modulator of the respective AMC which superimposes the envelope with the intermediate frequency (still in digital form) received by the NCO. The signals (TX_IF1, TX_IF2, ... TX_IFN) arriving from the digital modulator, which signals (TX_IF1, TX_IF2, ... TX_IFN) correspond to the envelopes modulated on a 1.5 MHz carrier signal (i.e. the intermediate frequency), are then relayed to an analog modulator that is associated with the respective master or slave (designated with "Mod" in FIGS. 1 through 3. In this the signal is then mixed with the modulation or mixing frequency LO (for example of 125 MHz) provided by the synthesizer. The required RF pulse with a frequency of 123.5 MHz, as it would be necessary for an H1 excitation at 3 Tesla, then arises via the mixing of a 125 MHz signal with the desired RF pulse modulated on the 1.5 MHz carrier. This signal (TX_HF1, TX_HF2, ... TX_HFN) is finally supplied to the transmission coils.

It is clear that, given excitation of a different nucleus and/or given other magnetic fields, correspondingly different mixing frequencies would have to be used. If the slaves should respectively individually excite various nuclei, instead of a transfer of the LO modulation frequency from the synthesizer of the master via the RF splitter the corresponding slaves are provided with their own synthesizers which respectively generate the corresponding separate modulation frequency for the desired nucleus. Only the synchronization then ensues via the system clock of 10 MHz, whereby the synthesizers of the slaves are also synchronized corresponding to the system clock of the master synthesizer.

In FIG. 5 it is further shown that both the frequency $\omega$ and the phase $\phi$ are transferred to the digital modulator via the NCO as a real part Re and an imaginary part Im, in order to define an RF pulse. In principle, however, it is sufficient when either the frequency $\omega$ and the phase $\phi$ are transferred via the NCO or only the real parts Re and imaginary parts Im of the function that describe the envelope, depending on which is more advantageous for the present measurement. For example, given a slice displacement it is sufficient to merely vary the frequency $\omega$. This means that, in order to thus rapidly vary the pulse, real part Re and imaginary part Im are only transferred for a first pulse of a sequence and only the new frequency $\omega$ is still transferred for subsequent pulses which provide for a measurement in adjacent slices.

The envelopes of the gradient waves (pulses) are likewise digitally generated within the computation unit in the form of suitable software and are transferred directly to the GPA (Grad 1, Grad 2, ... Grad N). In the exemplary embodiment shown in Figure A each AMC, regardless of whether master or slave, comprises a "Gradient Wave" unit. However, since in many cases the slaves possess no GPAs, the corresponding module "Gradient Waves" is also optional. Alternatively, a unit can also be located here which calculates the signals for the shim coils and outputs corresponding signals to an SPA.

Because it has its own NCO, each AMC is independent of the others with regard to the phase and frequency, and the individual AMCs are ultimately clocked or synchronized by the signals shown in FIG. 1.

A first significant synchronization level is the common clock source via the RF splitter. A system clock is thereby provided for all events within the system. This system clock is 10 MHz. It is output by the synthesizer of the master and respectively transferred via the red lines both to the sequencer and to the NCO and the respective digital modulators which require this system clock (among other things).

In addition to this first synchronization level of 10 MHz, there are three further synchronization levels that are respectively realized via emission of corresponding synchronization signals from the AMC master via an optical splitter (shown dashed in FIG. 5) to the respective AMC slaves.

A synchronization plane is thereby the sequence clock of 100 KHz which is designated here as a signal "SEQ_CLK". This signal comes from a "sequencer master clock" in the AMC master which passes the corresponding clock pulse to both its own sequencer and to the respective sequencers of the slaves via the optical splitter. The SEQ_CLK is the mother clock (master clock) for, all sequence-relevant events such as, for example, gradient pulses or the activation and deactivation of control signals. A compulsory synchronization of the slaves by the master thus ensues with regard to these sequence-relevant events. The sense of this synchronization plane can be seen using FIG. 6. Here the sequence clock of 100 KHz of the master is shown in an uppermost line. In a line located below this, a 100 KHz sequence clock of a slave is shown displaced by a temporal offset $\Delta T$, which sequence clock of the slave was not compulsorily synchronized. The RF pulse modulation signal (meaning the envelope which would be emitted by the master) is located below the sequence clock of the master and a corresponding RF pulse modulation signal of the slave is shown below the sequence clock of the slave. The temporal displacement of the 100 KHz clock without compulsory synchronization would lead to a corresponding temporal offset of the RF pulses, which would ultimately lead to a phase error in the measurement. The compulsory synchronization is therefore provided via the signal SEQ_CLK, such that such a temporal offset is safely avoided.

Figure 7:
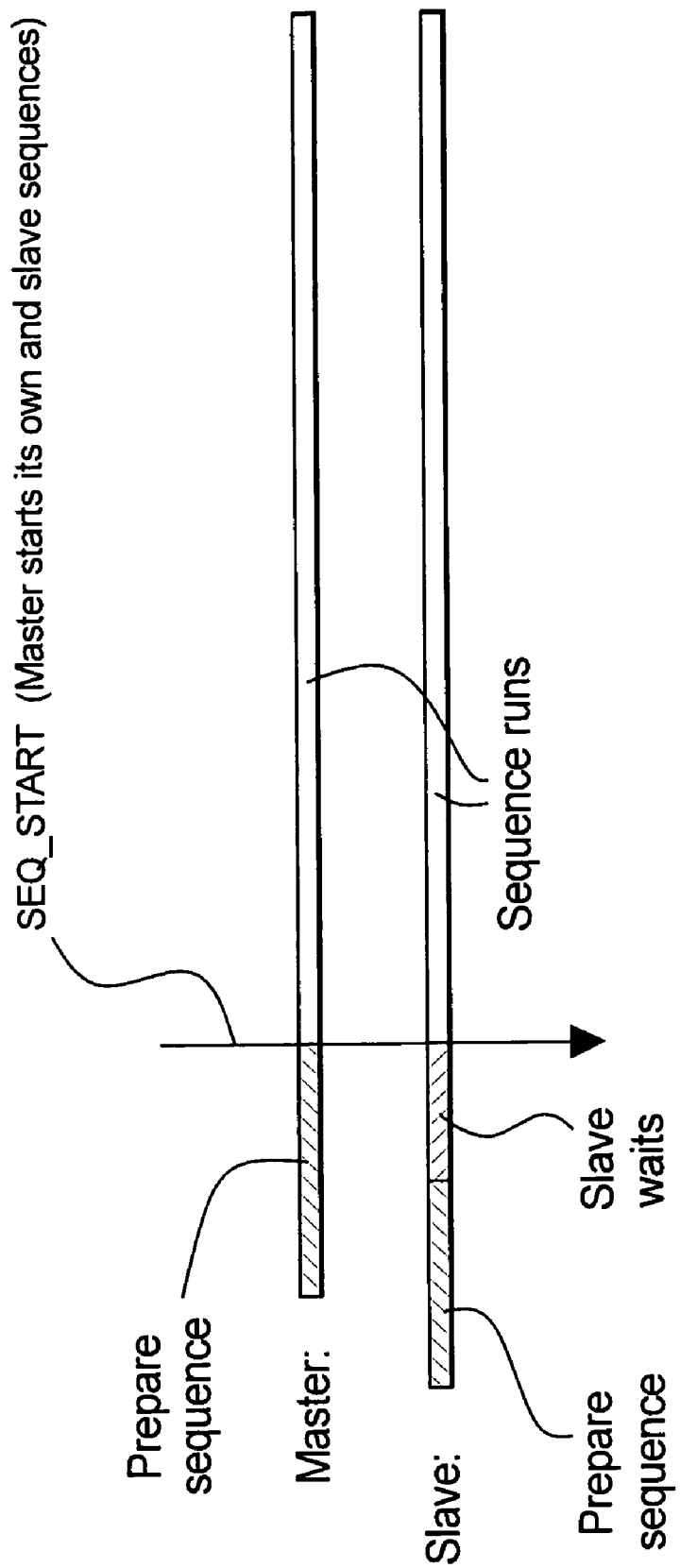
FIG. 7 illustrates that the sequences of the slaves is always prepared before the first sequence of the master is prepared.

A third synchronization plane is provided by the sequence start (signal "SEQ_START"). This is hereby a signal in the millisecond range. The actual start signal for the measurement is emitted with this sequence start (see also FIGS. 1 through 4). Moreover, FIG. 7 is referenced again in this regard, from which it is also apparent that—as described above—the sequences of the slaves must always be prepared first before the sequence of the master is prepared. There it is shown how the preparation of the sequence at the slaves is initially begun. The preparation of the master sequence then ensues temporally offset. When the sequence at the slave is prepared, the respective slaves wait until the separate sequence from the master and the slave sequences are started with the aid of the signal "SEQ_START". Only then does the measurement sequence run synchronized in the individual channels.

Figure 8:
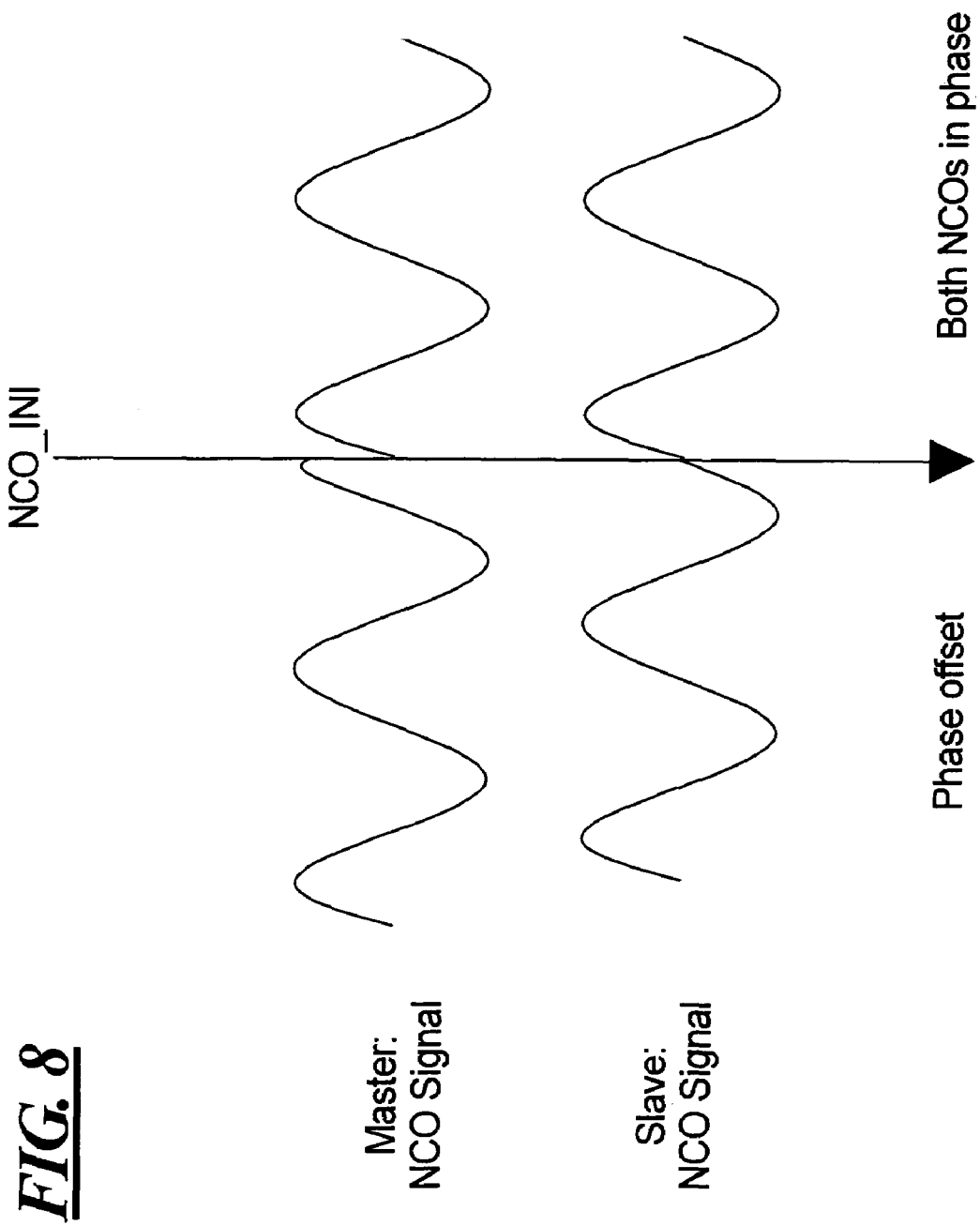
FIG. 8 shows how two NCO signals of the master and of the slaves are initialized.

Since, as described above, all modules advantageously operate with separate NCOs, in a fourth synchronization plane it is necessary to synchronize the phase position of the NCOs. For this a corresponding signal (NCO_INI) is sent out from an NCO init unit in the AMC master to the separate NCO of the master and, via the optical splitter, to the NCOs of all slaves. This is a short pulse in a 10 MHz pattern which was already emitted upon preparation of the sequence in order to commonly reset the NCOs and thus to bring them into phase. The depiction in FIG. 8 is referenced in this regard. In FIG. 8 it is shown how two NCO signals of the master and of the slave (which NCO signals phase-offset against one another) are initialized after receipt of the NCO_INI signal such that both NCOs oscillate in phase afterwards.

The system described above is particularly suited for activation and controlling of the labeling coils for an "arterial spin labeling" (ASL) method (labeling is a marking of examined parts during the measurement via suitable RF irradiation). For example, in ASL the blood that flows through the left or right carotid artery can be marked by suitable RF pulses and be tracked in the brain in the MR measurements (this is thus an alterative for contrast agent measurement).

Each module can have an independent, synchronized gradient signal generator containing an arbitrary number of dynamic shim channels. The slave modules are thus able to generate shim signals that are emitted to shim coils of the magnetic resonance system. The shim coils, for example, can be wound over the gradient coils in order to also be able to implement a shim of the second order.

The modules likewise can each contain an independent, synchronized gradient signal generator with an arbitrary number of gradient channels.

Each slave module can have its own host PC.

An eddy current compensation can ensue in each slave channel. For this purpose, each signal generator has at least one eddy current compensation circuit for generating a gradient-like eddy current.

Moreover, $B_0$ compensation in digital form can be implemented on the basic magnetic field. The switched gradients overcouple the basic field, which is an unwanted defect that is dependent on the design and structure of the basic field magnet, and will vary dynamically with the curve of the gradient values. The $B_0$ compensation tracks the transmission/reception frequency to the dynamic variations. For this purpose, each signal generator has at least one $B_0$ eddy current compensation unit.

Alternatively, an analog $B_0$ compensation can ensue with field coils.

A cross-term compensation can ensue across all slave channels. Cross-terms are couplings (dependent on the design) between the gradient channels. The cross-term compensation predistorts the individual gradient channels in order to minimize this effect. For this purpose, each signal generator has at least one cross-term compensation unit for eddy currents.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance imaging system comprising:
    a basic field magnet that generates a homogenous, static magnetic field;
    a gradient coil system and at least one gradient signal generator connected to the gradient coil system to cause said gradient coil system to emit magnetic gradient fields in a volume overlapping said static magnetic field;
    a plurality of independently-activatable radio frequency coils that each transmit and receive radio frequency energy;
    a plurality of radio frequency signal generator modules that are independent of each other and that are respectively connected to said plurality of radio frequency coils and that are configured to activate the respective radio frequency coils to transmit and receive radio frequency energy;
    a control unit that emits a synchronization signal to cause said radio frequency signal generator modules to be operated in synchronization with each other; and
    only one of said radio frequency signal generator modules being in direct communication with said control unit to receive said synchronization signal therefrom, said one of said radio frequency signal generator modules forming a master radio frequency signal generator module and a remainder of said radio frequency signal generator modules respectively forming slave radio frequency signal generator modules that respectively receive said synchronization signal only from said master radio frequency signal generator module.

2. A magnetic resonance system as claimed in claim 1 wherein each of said radio frequency signal generator modules comprises an oscillator unit and an initialization unit that emits an oscillator initialization signal to the oscillator in response to the synchronization signal.

3. A method for operating a magnetic resonance system comprising the steps of:
with a basic field magnet, generating a homogenous, static magnetic field;
with a gradient coil system and a gradient signal generator arrangement connected to the gradient coil system, emitting magnetic gradient fields from said gradient coil system in a volume overlapping said static magnetic field;
providing a plurality of independently-activatable radio frequency coils that each transmit and receive radio frequency energy;
providing a plurality of radio frequency signal generator modules that are independent of each other and that are respectively connected to said plurality of radio frequency coils to activate the respective radio frequency coils to transmit and receive radio frequency energy;
generating a synchronization signal in a control unit to cause said radio frequency signal generator modules to be operated in synchronization with each other;
placing only one of said radio frequency signal generator modules in direct communication with said control unit, and operating said one of said radio frequency signal generators as a master radio frequency signal generator module and operating a remainder of said radio frequency signal generator modules respectively as slave radio frequency signal generator modules; and
receiving said synchronization signal directly from said control unit only at said master radio frequency generator module and supplying said synchronization signal to the respective slave radio frequency generator modules only from said master radio frequency signal generator module.

4. A method as claimed in claim 3 wherein each of said radio frequency signal generator modules comprises an oscillator unit and an initialization unit, and comprising emitting an oscillator initialization signal to the oscillator in response to the synchronization signal.

5. A method as claimed in claim 3 comprising forming said gradient signal generator arrangement as a plurality of gradient signal generators, respectively disposed in the radio frequency signal generator modules, and controlling the respective gradient signal generators from said control unit with said synchronization signal.

6. A method as claimed in claim 5 comprising controlling the respective gradient signal generators to implement compensation of an influence of said magnetic gradient fields on said static magnetic field.

7. A method as claimed in claim 5 wherein each gradient signal generator represents a gradient channel, and comprising, in the respective gradient signal generators, pre-distorting a gradient signal generated thereby for cross-term compensation among the respective gradient channels.

8. A method as claimed in claim 7 comprising emitting said magnetic gradient fields along three spatial axes, and generating said gradient signals with the respective gradient signal generators for additionally effecting a cross-term compensation among the three spatial axes.

9. A method as claimed in claim 3 wherein each of said radio frequency signal generator modules comprises a modulator, and comprising emitting respective radio frequency signals at different frequencies from the respective radio frequency signal generator modules by synchronizing operation of the respective modulators with said synchronization signal.

10. A method as claimed in claim 3 comprising providing an eddy current compensation unit in each of said radio frequency signal generator modules, and compensating eddy currents by synchronizing operation of the respective eddy current compensation units with said synchronization signal.

11. A method as claimed in claim 3 comprising generating said synchronization signal as a digital signal having a bit frequency of approximately one nanno second.

12. A method as claimed in claim 3 comprising providing each of said radio frequency signal generator modules with its own post-computer.

13. A method as claimed in claim 3 comprising providing a shim coil current generator in each of said radio frequency signal generator modules, and supplying shim coil signals to respective shim coils to shim said static magnetic field, and synchronizing operation of the respective shim coil generators, and the respective shim coil currents generated thereby, with said synchronization signal.

14. A method as claimed in claim 3 comprising providing an SAR monitor in each of said radio frequency signal generator modules, and monitoring radio frequency power emitted by said radio frequency coils using the respective SAR monitors.

15. A method as claimed in claim 3 comprising operating said gradient signal generator arrangement and the respective radio frequency signal generator modules for arterial spin labeling in a magnetic resonance imaging sequence.

16. A method as claimed in claim 3 comprising operating said radio frequency signal generator modules as respective radio frequency transmission channels transmitting in a mode matrix to excite specific orthogonal resonance modes of said radio frequency coils.

17. A method as claimed in claim 16 comprising operating the respective radio frequency generator modules as transmission channels transmitting in a Butler matrix as said mode matrix.

* * * * *